(12) United States Patent
Shiraishi (10) Patent No.: US 6,700,641 B2
(45) Date of Patent: Mar. 2, 2004

(54) TEMPERATURE CONTROL METHOD AND EXPOSURE APPARATUS THEREBY

(75) Inventor: Naomasa Shiraishi, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/985,441

(22) Filed: Nov. 2, 2001

(65) Prior Publication Data

US 2002/0027645 A1 Mar. 7, 2002

Related U.S. Application Data

(63) Continuation of application No. 09/512,102, filed on Feb. 24, 2000, which is a continuation of application No. PCT/JP98/03744, filed on Aug. 24, 1998.

(30) Foreign Application Priority Data

Aug. 29, 1997 (JP) .............................................. 9-233846

(51) Int. Cl.[7] .......................... G03B 27/52; G03B 27/42
(52) U.S. Cl. .......................................... 355/30; 355/53
(58) Field of Search .............................. 355/30, 52, 53, 355/67–69

(56) References Cited

U.S. PATENT DOCUMENTS

| 4,724,466 A | * | 2/1988 | Ogawa et al. ................ 355/43 |
| 4,786,947 A | * | 11/1988 | Kosugi et al. ................ 355/30 |
| 4,852,133 A | | 7/1989 | Ikeda et al. |
| 4,989,031 A | | 1/1991 | Kamiya |
| 5,340,165 A | | 8/1994 | Sheppard |
| 5,435,379 A | | 7/1995 | Moslehi et al. |
| 5,579,084 A | | 11/1996 | Takahashi et al. |
| 5,812,242 A | | 9/1998 | Tokuda |
| 5,870,198 A | | 2/1999 | Takagi |
| 5,892,572 A | | 4/1999 | Nishi |
| 5,963,306 A | | 10/1999 | Tanitsu et al. |
| 6,002,987 A | | 12/1999 | Kamiya et al. |
| 6,036,162 A | | 3/2000 | Hayashi |

FOREIGN PATENT DOCUMENTS

| JP | A-63-42121 | 2/1988 |
| JP | A-5-164361 | 6/1993 |

\* cited by examiner

*Primary Examiner*—Henry Hung Nguyen
(74) *Attorney, Agent, or Firm*—Oliff & Berridge PLC (57) ABSTRACT

An exposure system includes a chamber and first and second temperature control units. The chamber contains a body of an exposure apparatus which forms a pattern on a substrate. The firs temperature control unit is mounted separate from the body of the exposure apparatus, and controls a temperature of a fluid taken through the body of the exposure apparatus. The second temperature control units is arranged between the body of the exposure apparatus and the first temperature control unit, and controls the temperature of the fluid taken through the first temperature control unit. The second temperature control unit also supplies the fluid to the body of the exposure apparatus. The ability of the second temperature control unit is designed differently from the ability of the first temperature control unit in terms of a magnitude of a temperature range within which the temperature of the fluid changes.

65 Claims, 6 Drawing Sheets

FIG. 1

PRIOR ART

FIG. 2

PRIOR ART

TEMPERATURE CONTROL METHOD AND EXPOSURE APPARATUS THEREBY

CROSS REFERENCE TO RELATED APPLICATION

This is a Continuation of Application Ser. No. 09/512,102 filed Feb. 24, 2000, which in turn is a Continuation of International Application No. PCT/JP98/03744 filed Aug. 24, 1998. The entire disclosure of the prior application(s) is hereby incorporated by reference herein in its entirety.

BACKGROUND OF THE INVENTION

1. Field of the Invention

The present invention relates to a method for controlling the temperature in the chamber of an exposure apparatus used in a photolithography process for producing a semiconductor element, an imaging element (CCD, etc.), a liquid crystal display element, a thin film magnetic head, etc., and to an exposure apparatus operated in the method.

2. Description of the Related Art

When a semiconductor element, etc. is produced, an exposure apparatus which transfers a pattern of a reticle as a mask to each shot area on the wafer to which resist is applied as a photosensitive substrate directly or through a projective optical system. Conventionally, an exposure apparatus (stepper) of a contraction projection type in a step-and-repeat system has been widely used as an exposure apparatus. However, a projective exposure apparatus in a step-and-scan system for synchronously scanning the reticle and the wafer for the projective optical system for exposure has recently arrested attention.

Figure 1:
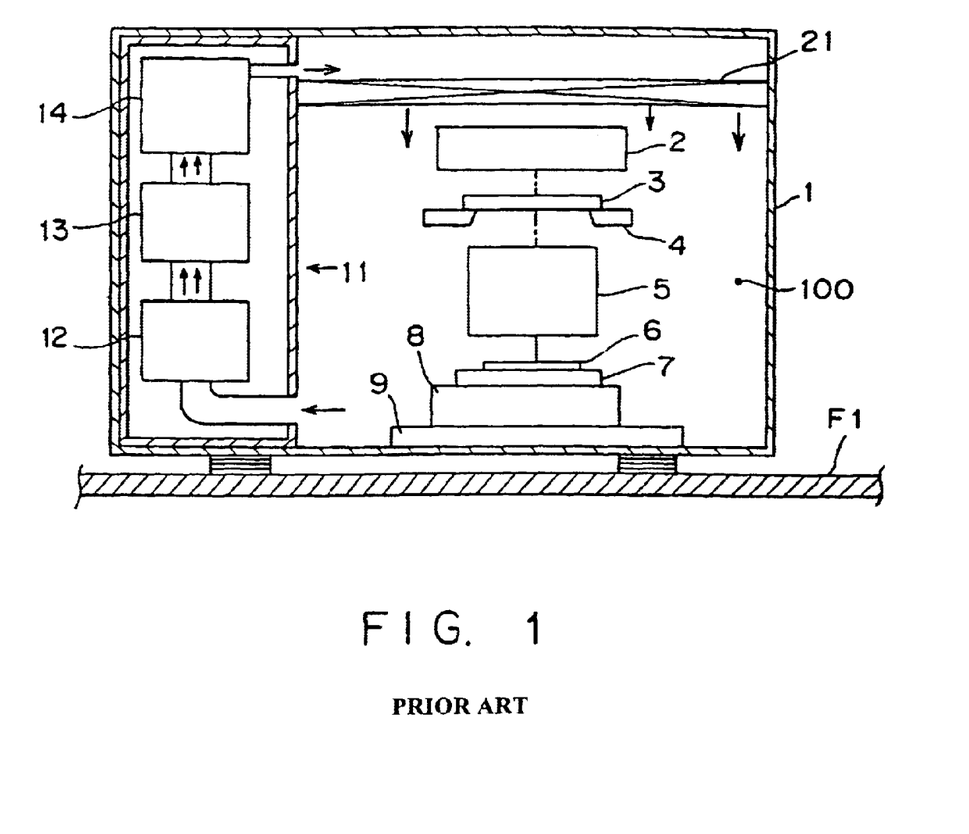
FIG. 1 is a sectional view showing the general configuration of a conventional exposure apparatus.

FIG. 1 shows the general configuration of a conventional exposure apparatus.

In FIG. 1, for example, a semiconductor element can be formed by overlapping for exposure a multiple-layer circuit pattern on a wafer 6 in a predetermined arrangement. Therefore, in the process of exposing the wafer 6, it is very important to improve the precision in alignment between the pattern image to be exposed and the existing pattern on the wafer 6, and the precision in controlling a focus position. Therefore, the exposure apparatus has an isolation room called a 'chamber' which is controlled such that the temperature in the exposure apparatus can indicate a constant value, and contains the body of an exposure device including precision parts such as a projective optical system 5, a stage, etc. The body of the exposure device includes a lighting optical system 2, a reticle stage 4 for holding and aligning a reticle 3, the projective optical system 5, and a wafer holder 7 for holding the wafer 6, and a wafer stage 8 for aligning the wafer 6 (the wafer holder 7). The wafer stage 8 is mounted on the floor of the chamber 1 through a frame material 9. The chamber 1 is mounted on a floor F1 in a semiconductor factory.

To keep a constant temperature in the chamber 1, a fluid supply device 11 is provided in the chamber 1. The fluid supply device 11 is equipped with a cooler 13 and a heater 14, introduces the air outside or inside the chamber 1, controls the temperature at a constant value by the effect of the cooler 13 and the heater 14, and supplies the air into the chamber 1. The cooler 13 compresses and liquidizes a coolant by a compressor, etc., cools the air with evaporation heat, and has a power source such as a motor, etc. for operating the compressor. Each of the parts such as a stage provided in the chamber 1 is considerably heavy, and requires a high-speed operation, thereby largely heating each of them. Accordingly, the fluid supply device 11 of the chamber 1 is requested to maintain a strong cooling ability, thereby requiring a large compressor of the cooler 13.

In addition, to prevent fine dust harmful in transferring a circuit pattern from being lead into the chamber 1, the temperature-controlled air is to be supplied to the chamber 1 through a dust filter 21 such as a HEPA filter (high efficiency particulate air-filter). Therefore, the compressor formed by a pressure fan 12 for a blow and a motor is required to output pressure strong enough to pass the air blow through the dust filter 21. As a result, a large pressure fan 12 and a large motor are used.

Figure 2:
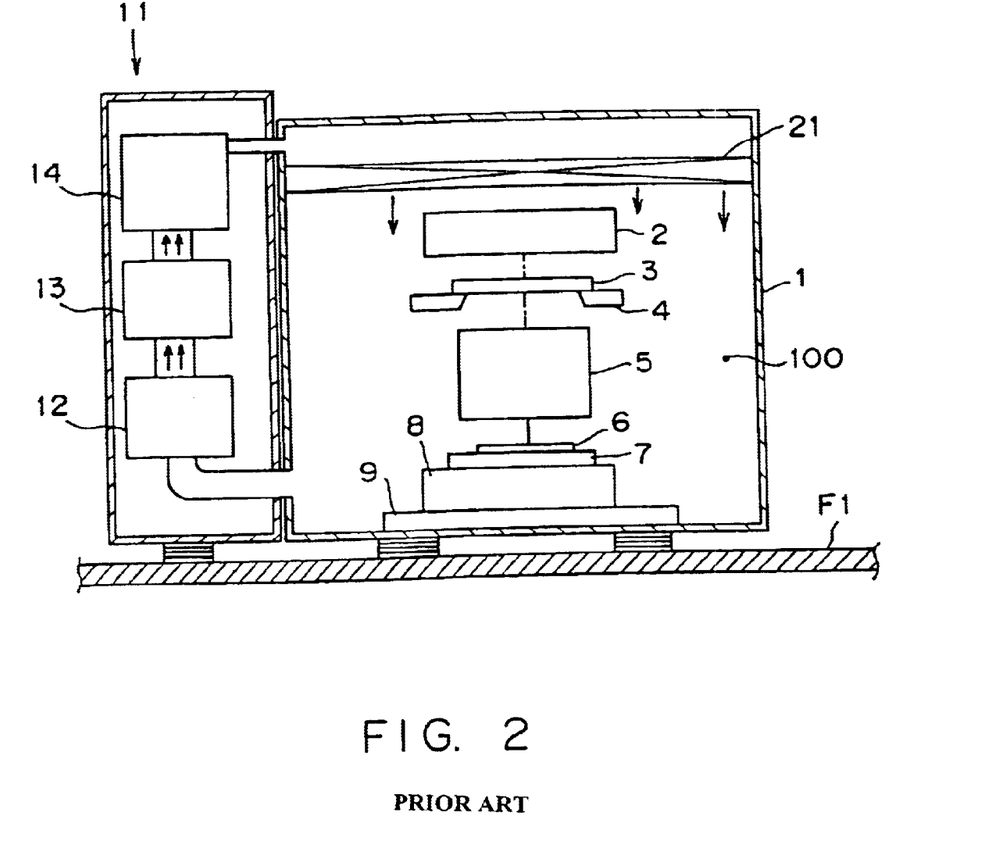
FIG. 2 is a sectional view showing the general configuration of another conventional exposure apparatus.

FIG. 2 shows the general configuration of another conventional exposure apparatus.

The exposure apparatus shown in FIG. 2 is different from the exposure apparatus shown in FIG. 1 in that the fluid supply device 11 is not mounted in the chamber 1, but on the external wall of the fluid supply device 11. Otherwise, they have the same configuration. That is, each of them includes the lighting optical system 2, the reticle stage 4 for holding and aligning the reticle 3, the projective optical system 5, the wafer holder 7 holding the wafer 6, the wafer stage 8, the frame material 9, etc. in a constant temperature room 100. In addition, the exposure apparatus shown in FIG. 2 is the same as that shown in FIG. 2 in that the fluid supply device 11 has the pressure fan 12, the cooler 13, and the heater 14, and blows into the constant temperature room 100 by passing the temperature-controlled air through the dust filter 21 to control the temperature in the chamber 1. The chamber 1 provided with the fluid supply device 11 is mounted on the floor F1 in the semiconductor factory.

Furthermore, a device has been developed not only to maintain a constant temperature in the chamber 1, but also to supply a fluid at a constant temperature to a specific local area (a coil portion of a linear motor, etc.) of an exposure apparatus so that the portion can be more effectively temperature-controlled.

As described above, the conventional exposure apparatus includes the fluid supply device 11 in the chamber 1 or on the external wall of the chamber 1. As a result, the vibration generated during the operation of the fluid supply device 11 unfavorably lowers the precision in alignment, etc. of the exposure apparatus.

That is, the vibrations generated by the compressor of the cooler 13 forming part of the fluid supply device 11, and the pressure fan 12 and the motor of the compressor vibrate the wafer stage 8 of the wafer 6, thereby deteriorating the alignment precision of the wafer 6, and also the overlapping precision, or vibrate the projective optical system 5 to lower the contrast of the transferred image.

In the conventional exposure apparatus, since the vibration of the fluid supply device for a chamber 1 during the operation has a minor influence with the requested precision taken into consideration, thereby generating a serious problem. However, with an increasing number of smaller semiconductor integrated circuits, etc., the influence of the vibration cannot be ignored because the alignment precision, etc. requested to the exposure apparatus becomes more strict.

SUMMARY OF THE INVENTION

The present invention has been developed based on the above described background, and aims at the first object of providing a method of controlling the temperature in a chamber of an exposure apparatus having the body of an exposure device, and a method of controlling the temperature to reduce an unfavorable influence from the vibration caused by the temperature control. Furthermore, the present invention aims at the second object of providing an exposure apparatus capable of using the above described temperature control method.

In the temperature control method according to the present invention is used with a chamber (1) containing the body of an exposure device for transferring a mask pattern to the substrate, a fluid (a gas, a liquid) supplied to the chamber (1) from a fluid supply device (11, 11A, 11B) provided independent of the chamber (1) is output, supplied from the fluid supply device (11, 11A, 11B), and is temperature-controlled before supplied into the chamber (1).

With the present invention, the temperature in the chamber can be controlled by controlling the temperature of a fluid supplied to the chamber. Thus, the temperature adjustment equipment, which has been in a chamber as a vibration source, can be mounted outside the chamber, thereby removing the vibration source from the chamber. In addition, since the vibration during the temperature-control of the fluid is hardly transmitted into the chamber, an unfavorable influence such as the deterioration in the alignment precision in the body of the exposure device causing the vibration can be reduced.

Furthermore, in the exposure apparatus according to the present invention, the body of an exposure device for transferring a mask pattern to the substrate is provided in the chamber (1). The exposure apparatus has a fluid supply device (11, 11A, 11B) mounted outside the chamber, and supplies a temperature control fluid into the chamber (1). With the above described present invention, the vibration of the fluid supply device (11, 11A, 11B) for outputting a temperature control fluid is hardly transmitted into the chamber (1), the temperature control method according to the present invention can be used almost successfully.

In this case, it is desired that the present invention includes a temperature control device (18, 24, 43) for controlling the temperature of the fluid output from the fluid supply device (11, 11A, 11B), and transmitting the fluid into the chamber (1), thereby controlling the temperature in the chamber (1) at a predetermined temperature. At this time, since the temperature control device (18, 24, 43) controls the temperature of the fluid transmitted into the chamber (1), the temperature control method according to the present invention can be applied.

Furthermore, the final control of the temperature of the fluid led to the chamber (1) is not performed by the fluid supply device (11, 11A, 11B) located away from the chamber, but by, for example, the temperature control device (18, 24, 43) located near the constant temperature room in the chamber (1). Therefore, although the fluid supply device (11, 11A, 11B) is distant from the chamber (1), the feedback loop of the temperature control is not elongated, and the temperature in the chamber (1), or the temperature of the fluid used in the chamber (1) can be maintained precisely at a predetermined level. Thus, the body of the exposure device of a projective optical system (5), a stage system (4, 8), etc. is maintained at a constant temperature, thereby realizing a precision exposure apparatus with little vibration.

In this case, it is desired that the fluid supply device (11, 11A, 11B) includes a fluid supply device (13–14, 13–14a–14b) for controlling the temperature of the fluid. The level of the temperature control by the temperature control device (18, 24, 43) located near the chamber (1) is low when the temperature of the fluid to e supplied to the chamber (1) is roughly controlled by the fluid supply device (13–14, 13–14a–14b), thereby easily designing the temperature control device (18, 24, 43) using a heater without a vibration source or temperature control elements such as a Peltier element (18), and reducing the vibration in the chamber (1).

A liquid supply device (11A) outputs, for example, a plurality of fluids at different temperatures, and a temperature control device (24) mixes the plurality of fluids at a predetermined ratio. A fluid at a desired temperature can be obtained by controlling the mixing ratio of the plurality of fluids at different temperatures.

In addition, it is desired that the present invention further includes a detector (19) for detecting the temperature of the fluid controlled by the temperature control device (18, 24, 43), and at least one of the temperature control device (18, 24, 43) and the fluid supply device (13–14, 13–14a–14b) controls the temperature of the fluid based on the detection result of the detector (19). The control precision of the temperature in the chamber (1) can be improved by feeding back the temperature of the detector (19) mounted together with the chamber (1).

Furthermore, it is desired that the fluid supply device (11, 11A, 11B) is mounted on the floor different from the floor on which the chamber (1) is mounted. Thus, the vibration of the fluid supply device (11, 11A, 11B) is not transmitted into the chamber (1).

It is also desired that the fluid supply device (11, 11A, 11B) is designed such that the vibration of the fluid supply device (11, 11A, 11B) cannot be transmitted to the body of the exposure device.

In the exposure apparatus according to the present invention, the body of the exposure device for transferring a mask pattern on the substrate is mounted in the chamber (1) controlled for a predetermined temperature, and the fluid machinery room (11, 11A, 11B) for controlling the temperature in the chamber (1) is mounted under the floor on which the chamber (1) is mounted. In the second exposure apparatus, the vibration during the temperature control of the machinery room (11, 11A, 11B) is not transmitted into the chamber (1), thereby reducing the unfavorable influence caused by the vibration in the body of the exposure device such as the deterioration in alignment precision, etc.

The exposure system according to one aspect of the present invention includes: a chamber containing the body of an exposure device which forms a pattern on a substrate; a first temperature control unit, mounted separate from the body of the exposure device, for controlling the temperature of a fluid taken through the body of the exposure device; and a second temperature control unit, connected to the first temperature control unit, for controlling the temperature of the fluid taken through the first temperature control unit, and supplying it to the body of the exposure device. The second temperature control unit has a control ability different from that of the first temperature control unit.

The exposure system according to another aspect of the present invention includes: a chamber containing the body of an exposure device which forms a pattern on a substrate; and a fluid supply device, mounted on a plane different from the plane on which the chamber is mounted, for supplying a fluid into the chamber.

The exposure system according to another aspect of the present invention includes: a chamber containing the body of an exposure device which forms a pattern on a substrate; and a fluid supply device, mounted separate from the body of the exposure device, for supplying a fluid into the chamber. At least one of the chamber and the fluid supply device is mounted using a vibration-proof material The temperature control method according to another aspect of the present invention controls the temperature in a chamber containing the body of an exposure device which forms a pattern on a substrate. In this method, a first temperature control unit mounted separate from the body of the exposure device controls the temperature of a fluid taken through the body of the exposure device, and a second temperature control unit having a control ability different from that of the first temperature control unit controls the temperature again of the fluid taken through the first temperature control unit, and then supplies the fluid to the body of the exposure device.

The temperature control method according to another aspect of the present invention controls the temperature in a chamber containing the body of an exposure device which forms a pattern on a substrate. In this method, a fluid supply device mounted on a plane different from a plane on which the chamber is mounted supplies a fluid whose temperature has been adjusted into the chamber.

The temperature control method according to another aspect of the present invention controls the temperature in a chamber containing the body of an exposure device which forms a pattern on a substrate. In this method, a fluid supply device mounted separate from the body of the exposure device supplies a fluid whose temperature is adjusted to the chamber. At least one of the chamber and the fluid supply device is mounted using a vibration-proof material.

The exposure system producing method according to another aspect of the present invention produces an exposure system, and includes: a chamber containing the body of an exposure device which foims a pattern on a substrate; a first temperature control unit, mounted separate from the body of the exposure device, for controlling the temperature of a fluid taken through the body of the exposure device; and a second temperature control unit, connected to the first temperature control unit, for controlling the temperature of the fluid taken through the first temperature control unit, and supplying it to the body of the exposure device. The second temperature control unit has a control ability different from that of the first temperature control unit.

The exposure system producing method according to another aspect of the present invention produces an exposure system, and mounts on a predetermined plane a chamber containing the body of an exposure device which forms a pattern on a substrate, and mounts on a plane different from the plane of the chamber a fluid supply device for supplying a fluid to the chamber.

The exposure system producing method according to another aspect of the present invention produces an exposure system, includes a chamber containing the body of an exposure device which forms a pattern on a substrate, and mounts a fluid supply device for supplying a fluid to the chamber separate from the body of the exposure device using a vibration-proof material.

The exposure system producing method according to another aspect of the present invention produces an exposure system, mounts using a vibration-proof material a chamber containing the body of an exposure device which forms a pattern on a substrate, and mounts a fluid supply device for supplying a fluid to the chamber separate from the body of the exposure device.

The exposure system according to another aspect of the present invention includes: a chamber, mounted on a predetermined plane, containing the body of an exposure device forming a pattern on a substrate; a fluid supply device, mounted separate from the body of the exposure device on the same plane, for supplying a fluid to the chamber; and a connection material mounted between the chamber and the fluid supply device, for connecting the chamber and the fluid supply device such that the fluid can be transmitted between the chamber and the fluid supply device. The exposure system is designed to prevent the vibration generated by the fluid supply device during the operations from being transmitted to the body of the exposure device.

The temperature control method according to another aspect of the present invention controls the temperature in a chamber containing the body of an exposure device forming a pattern on a substrate. In this method, a fluid whose temperature is adjusted is supplied to the chamber from a fluid supply device mounted to the chamber through a connection material on the same plane as the chamber. Thus, the vibration generated by the fluid supply device during the operations is not transmitted to the fluid supply device.

The exposure system producing method according to another aspect of the present invention produces an exposure system, includes on a predetermined plane a chamber containing the body of an exposure device which forms a pattern on a substrate, and mounts on the same plane a fluid supply device for supplying a fluid to the chamber separate from the body of the exposure device. A connection material for connecting the chamber to the fluid supply device is provided between the chamber and the fluid supply device so that the fluid can be transmitted between the chamber and the fluid supply device. The exposure system is designed to prevent the vibration generated by the fluid supply device during the operations from being transmitted to the body of the exposure device.

According to the present invention described above, the vibration of the fluid supply device for providing a fluid for temperature control is hardly transmitted into the chamber, thereby realizing the exposure system using the temperature control method of the present invention.

Since the fluid supply device for supplying a temperature control fluid and its chamber are mounted on different floors according to the present invention, the vibration is hardly transmitted between them, thereby realizing the exposure system using the temperature control method of the present invention.

Since the vibration-proof material is applied to prevent the vibration from being transmitted between the fluid supply device for supplying a temperature control fluid and the chamber, the vibration is hardly transferred, thereby realizing the exposure system using the temperature control method of the present invention.

According to the present invention, since the fluid supply device for supplying a temperature control fluid is located away from the chamber by the distance for attenuation of 25% (6 dB) or more of the vibration, the vibration is hardly transmitted, thereby realizing the exposure system using the temperature control method of the present invention.

According to the present invention, the vibration of the fluid supply device for supplying a temperature control liquid is hardly transmitted to the chamber, thereby realizing the temperature control method of the present invention.

According to the present invention, since the fluid supply device for supplying a temperature control fluid and the chamber are mounted on different positions, the vibration is hardly transmitted, thereby realizing the temperature control method of the present invention.

According to the present invention, since there is a vibration-proof material to prevent the vibration from being transmitted between the fluid supply device for supplying a temperature control fluid and the chamber, the vibration is hardly transmitted, thereby realizing the temperature control method of the present invention.

DESCRIPTION OF THE PREFERRED EMBODIMENTS

The best mode for embodying the present invention is described below by referring to FIGS. 3 and 4.

Figure 3:
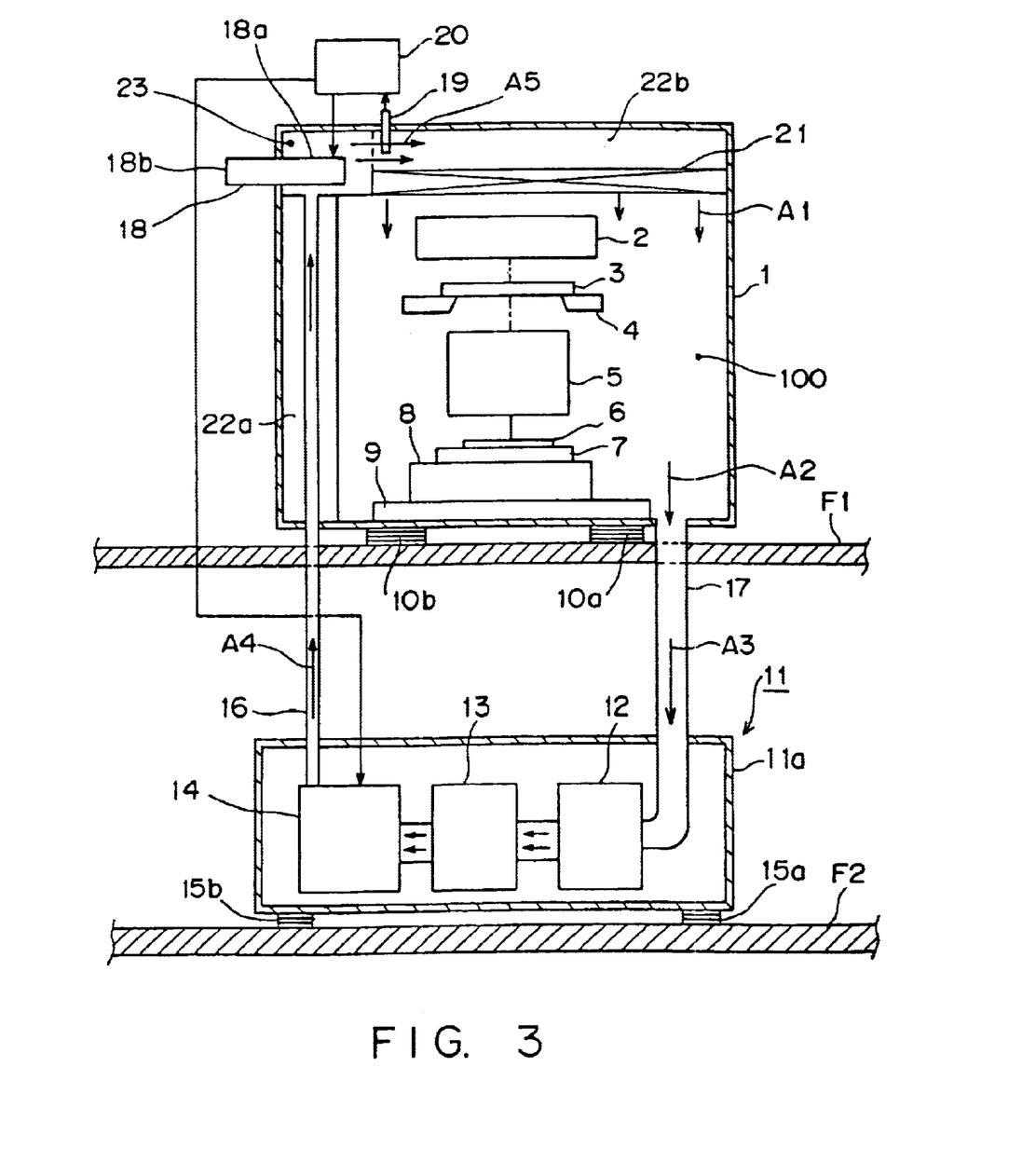
FIG. 3 is a sectional view showing the general configuration of the best mode of an exposure apparatus embodying the present invention.

FIG. 3 is a sectional view showing the general configuration of the best mode of an exposure apparatus embodying the present invention. In FIG. 3, a box-shaped chamber 1 is mounted on the floor F1 of a semiconductor factory through four vibration-proof pads (FIG. 3 shows two of them, that is, vibration-proof pads 10a and 10b) comprising an air damper, or a hydraulic damper, etc. The chamber 1 is sectioned into a preliminary room 22a through which a blow duct 16 of a temperature control gas (air in the present embodiment), a temperature control room 23 in which the temperature of the gas is finally controlled, a filter room 22b in which the dust in the air is filtered at the ceiling of the chamber 1, and the constant temperature room 100 in which the temperature of the internal air can be kept at a predetermined temperature.

The body of the exposure device comprises: the lighting optical system 2 comprising an optical integrator for leveling the illuminance distribution of exposure light, a condenser lens system, etc.; the reticle stage 4 for holding and aligning the reticle 3 as a mask; the projective optical system 5; the wafer holder 7 for holding the wafer 6 to be exposed; and the wafer stage 8 for three-dimensionally aligning the wafer 6 (the wafer holder 7). An exposure light source can be a mercury lamp, a laser light such as an excimer laser light, etc. The exposure light source can be stored in the lighting optical system 2. According to the present embodiment, an excimer laser light is used as the exposure light source. As described later, the excimer laser light source is mounted under the floor of the chamber 1. The wafer stage 8 is mounted on the chamber 1 through the frame material 9.

During the exposure, a reduced image of the pattern formed by the reticle 3 is sequentially transferred to each of the shot areas of the wafer 6 through the projective optical system 5 in the step and repeat system. Thus, the exposure apparatus according to the present embodiment is operated in the stepper system, however, the present invention can also be applied when a projective exposure apparatus, etc. in the step and scan system is used as an exposure apparatus.

As disclosed by the U.S. Pat. No. 5,528,118, the wafer stage 8 is not mounted on the floor of the chamber 1, but the chamber 1 comprises walls and a ceiling, and the wafer stage 8 can be mounted directly on the floor F1 of the factory through the frame material 9. Thus, the reaction force generated by the movement of the wafer stage 8 can be mechanically released into the floor F1.

In addition, as disclosed by the U.S. Pat. No. 5,874,820, the reticle stage 4 can be mounted directly on the floor F1 of the factory. Thus, the reaction force generated by the movement of the reticle stage 4 can be mechanically released into the floor F1.

Since there are heating units such as the wafer stage 8, etc. in the apparatus, the temperature in the constant temperature room 100 gradually rises with the accumulation of the heat in the airtight state. Therefore, a gas A1 (air in the present embodiment) which is kept at a constant temperature and has passed from the filter room 22b through the dust filter 21 such as a HEPA filter, etc. is constantly supplied into the constant temperature room 100 of the chamber 1. The gas A1 receives the heat from the heating units such as the lighting optical system 2, the wafer stage 8, etc., turns into a high-temperature gas A2, and is exhausted outside the constant temperature room 100 from the opening of the floor of the chamber 1 through an exhaust duct 17. The temperature of the gas in the constant temperature room 100 can be maintained at a predetermined target temperature (for example, 21° C.) by the blow of a gas at a constant temperature (constant temperature blow).

The exhaust duct 17 passes through the hole in the floor F1 of the factory, and reaches the fluid supply device 11 mounted under the floor F1. According to the present invention, the fluid supply device 11 corresponds to a machinery room, and is mounted on a floor F2 under the floor F1. That is, a cover 11a of the fluid supply device 11 is mounted on the floor F2 through vibration-proof pads 15a and 15b, and the exhaust duct 17 is led into the cover 11a. A gas A3 exhausted from the constant temperature room 100 is pressured by the pressure fan 12 in the cover 11a of the fluid supply device 11, and is cooled and dehumidified by the cooler 13. Then, the temperature of the gas A3 is adjusted by the heater 14 for a predetermined temperature (for example, 21° C. if the target temperature in the constant temperature room 100 is 21° C.), and the gas A3 is then supplied to the blow duct 16. The blow duct 16 passes through the hole in the floor F1 above from the cover 11a, and is led to the temperature control room 23 through the preliminary room 22a.

It is desired that the exhaust duct 17 and the blow duct 16 are made of elastic materials such as rubber, or shaped as bellows structures to prevent the vibration generated by the fluid supply device 11 from being transmitted to the floor F1. In addition, the exhaust duct 17 and the blow duct 16 are connected to the chamber 1 through the hole using an elastic material inserted between the hole and the duct.

A temperature-controlled gas A4 supplied from the blow duct 16 is transmitted to the chamber 1 through the hole in the floor F1 above, and enters the temperature control room 23. A part of a Peltier element 18 is provided as a temperature control element in the temperature control room 23, and the temperature of the gas A4 supplied from the blow duct 16 is correctly adjusted to the target temperature in the constant temperature room 100 using the Peltier element 18. A gas A5 completely maintained at a constant temperature is transmitted to the filter room 22b, and into the constant temperature room 100 as the gas A1 through the dust filter 21 in the filter room 22b.

A temperature sensor (thermometer) 19 is provided near the exhaust of the temperature control room 23 in the filter room 22b to correctly adjust the temperature of the gas in the filter room 22b and the constant temperature room 100 to the target temperature. The measurement value of the temperature sensor 19 is transmitted to a control system 20, and the control system 20 controls the polarity and the intensity of the electric current to be transmitted to the Peltier element 18 depending on the measurement value of the temperature sensor 19, thereby maintaining the temperature of the gas exhausted from the temperature control room 23 at the above described target temperature.

The Peltier element 18 is mounted such that, for example, one end 18a projects into the temperature control room 23 while the other end 18b projects outside the chamber 1. With the Peltier element 18 mounted as described above, the polarity (positive or negative) and the intensity (electric current value) of the electric current flowing through the Peltier element 18 can be controlled to exhaust the heat in the temperature control room 23 out of the chamber 1, that is, to lower the temperature of the gas exhausted from the temperature control room 23, and to take the heat outside the chamber 1 into the temperature control room 23, that is to rise the temperature of the gas exhausted from the temperature control room 23. Thus, according to the present embodiment, the temperature of the gas supplied to the constant temperature room 100 of the chamber 1 is finally controlled precisely at a target temperature.

In this case, the temperature of the gas A4 supplied to the temperature control room 23 in which the Peltier element 18 is mounted is preliminarily controlled by the fluid supply device 11 on the floor below. The pressure fan 12 and the cooler 13 in the fluid supply device 11 contain a compressor, a fan, and a motor with a high-level output, and large vibration sources. However, since these vibration sources are mounted on the floor F2 below the floor F1 on which the chamber 1 storing the body of the exposure device (the body of the exposure apparatus) is mounted, the vibration cannot have an influence on the body of the exposure device mounted on the floor F1 above.

In addition, in the exposure apparatus of the present embodiment, an exposure light source is mounted below the floor F1 on which the chamber 1 is mounted.

Figure 4:
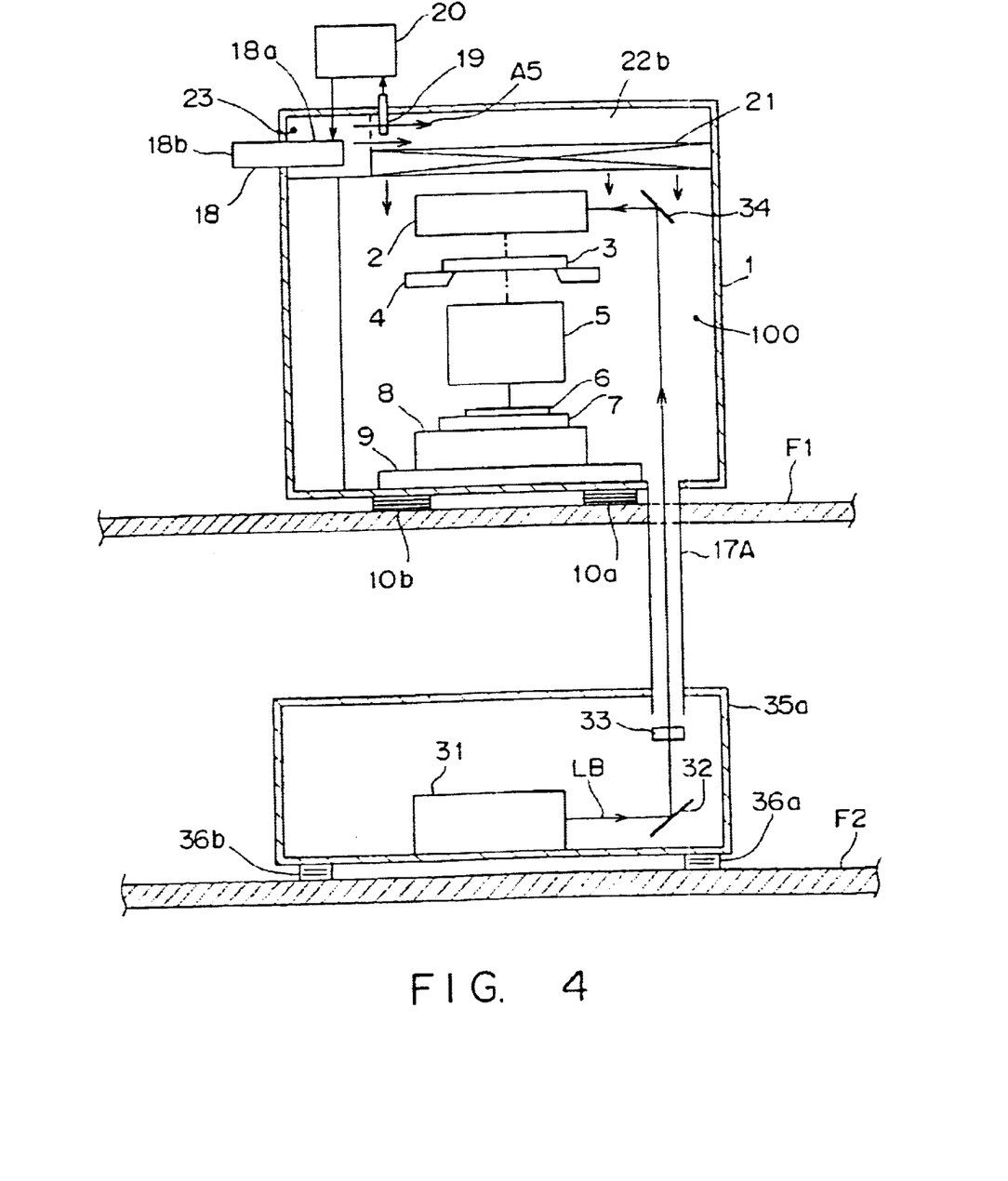
FIG. 4 is a sectional view showing the general configuration of the exposure light source of the exposure apparatus shown in FIG. 3.

FIG. 4 shows the exposure light source of the exposure apparatus shown in FIG. 3. In FIG. 4, a light source cover 35a is provided through vibration-proof pads 36a and 36b on the floor F2 below. An excimer laser light source 31 is provided as an exposure light source in the light source cover 35a. During the exposure, the ultraviolet pulse light LB as an exposure light from the excimer laser light source 31 is reflected upward by a mirror 32 for refraction of a light path, and then input to a light path cover 17A provided for the hole in the upper plate of the light source cover 35a through an optical material 33 for matching used to horizontally adjust the light path. The light path cover 17A reaches the constant temperature room 100 of the chamber 1 through the hole in the floor F1 above. An ultraviolet pulse light LB led to the constant temperature room 100 through the light path cover 17A is reflected by a mirror 34 of the body of the exposure device, input to the lighting optical system 2, and then irradiated from the lighting optical system 2 to the reticle 3.

In this case, the excimer laser light source 31 is a heat source. However, since the heat source is mounted under the floor of the chamber 1 storing the body of the exposure device, the heat source has no influence on the body of the exposure device.

In FIG. 3, the fluid supply device 11 on the floor F2 is mounted such that it can be adjacent to the exposure light source. In addition, according to the present embodiment, vibration-proof pads 15a and 15b are provided between the cover 11a of the fluid supply device 11 and the floor F2 such that the vibration of the pressure fan 12 and the cooler 13 can be prevented from being transmitted through the floor F2 and then reaching the exposure light source. Thus, the fluid supply device 11 and the exposure light source can be provided close to each other in parallel below the floor of the chamber 1.

According to the present embodiment, when the fluid supply device 11 is separate from the chamber 1, the temperature fluctuation (overshoot, etc. generated by unstable control) can be caused by an offset generated between the temperature around the blow window of the heater 14 and the temperature measured by the temperature sensor 19 if the heater 14 in the fluid supply device 11 is feedback-controlled using the temperature measurement value (for example, a measurement value by the temperature sensor 19) in the chamber 1. However, according to the present embodiment, since the Peltier element 18 is mounted immediately before the temperature sensor 19 in the chamber 1 in addition to the fluid supply device 11 having a large output capacity, the distance between the temperature sensor 19 and the Peltier element 18 is short, and the control delay time can be shortened, thereby causing no possibility that the final temperature of the gas becomes unstable during the temperature control.

Furthermore, the temperature control element in the temperature control room 23 is not limited to the Peltier element 18. For example, if the temperature control value of the gas A4 is constantly set to the value lower than a target temperature by the heater 14 in the fluid supply device 11 amounted on the floor below the floor F1 of the factory, then a heater which is formed by an electric heating line, etc. and has only the heating function can be used as a temperature control element in the temperature control room 23. Any element described above can be adopted as a temperature control element without generating vibration during the operations, thereby the alignment precision or the contrast of a transferred image, etc. can be maintained at a high level.

When the temperature control using the Peltier element 18 in the temperature control room 23 indicates the heating or radiation at a level equal to or higher than a predetermined value, the control system 20 transmits an instruction to the heater 14 in the fluid supply device 11 to change the temperature of the gas A4 output from the heater 14.

Figure 5:
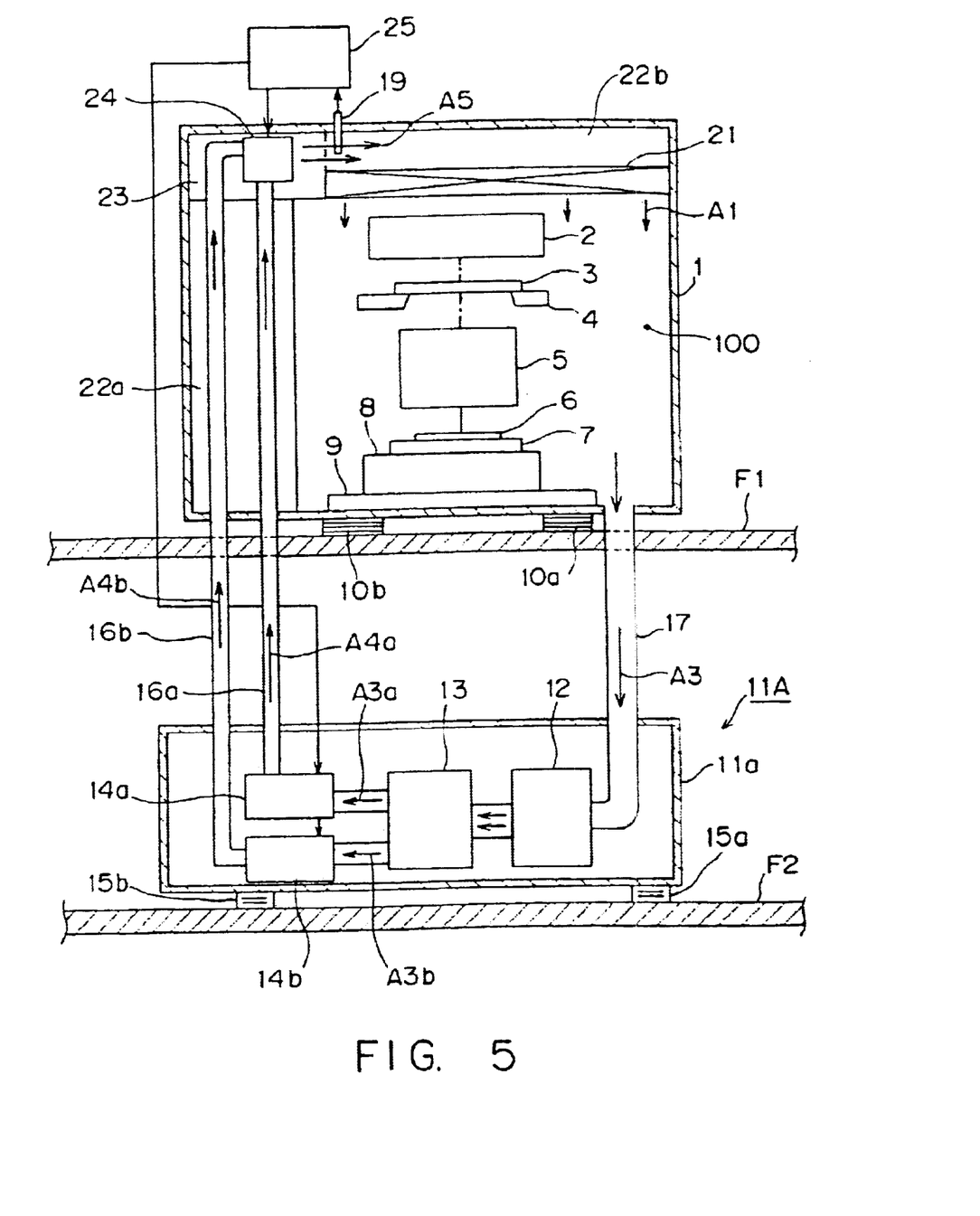
FIG. 5 is a sectional view showing the general configuration of the first embodiment of the exposure apparatus embodying the present invention.

Another aspect of the first embodiment of the present invention is described below by referring to FIG. 5. The present embodiment can be designed by changing the configuration of the fluid supply device of the best mode of the present invention. In FIG. 5, the portion corresponding to that shown in FIG. 3 is assigned the same unit number, and the detailed explanation is omitted here.

FIG. 5 shows the configuration of the exposure apparatus according to the present aspect of the embodiment. In FIG. 5, the body of the exposure device is mounted in the constant temperature room 100 of the chamber 1. The gas A3 transmitted from the constant temperature room 100 to the fluid supply device 11A through the exhaust duct 17 is compressed by the pressure fan 12 in the cover 11a of the fluid supply device 11A, cooled and dehumidified by the pressure fan 12, branched into two gases A3a and A3b, and respectively transmitted to different heaters 14a and 14b such as electric heaters, etc.

Thus, in the heaters 14a and 14b, the branched gases A3a and A3b are set to a little different temperatures based on the target temperature (for example, 21° C.) in the constant temperature room 100. For example, the gas A3a is set to the temperature different from the target temperature by +0.05° C. in the heater 14a, and is supplied as the gas A4a to a blow duct 16a. On the other hand, the gas A3b is set to the temperature different from the target temperature by −0.05° C. in the heater 14b, and is supplied as the gas A4b to a blow duct 16b. The blow ducts 16a and 16b are led to a gas mixer 24 in temperature control room 23 provided at the ceiling of the chamber 1 from the cover 11a through the hole made in the floor F1 above, and through the preliminary room 22a in the chamber 1.

According to the present aspect, the gas mixer 24 functions as a temperature control device. Temperature-controlled gases A4a and A4b provided for the blow ducts 16a and 16b are led to the chamber 1 in parallel through the hole in the floor F1, and transmitted to the gas mixer 24 in the temperature control room 23. The gas mixer 24 generates the gas A5 by mixing at a set mixing rate the two gases A4a and A4b different from each other in temperature, and transmits the gas A5 to the filter room 22b. At this time, unnecessary gases are returned to the pressure fan 12 from the gas mixer 24 through a duct not shown in the attached drawings.

Also according to the present aspect of the embodiment, the temperature sensor 19 is mounted near the exhaust opening of the temperature control room 23 in the filter room 22b. The measurement value of the temperature sensor 19 is transmitted to the control system 25, and the control system 25 maintains the temperature of the gas A5 to be supplied from the gas mixer 24 to the filter room 22b at the above described target temperature by controlling the mixing rate between the gases A4a and A4b in the gas mixer 24 based on the measurement value of the temperature sensor 19. At least one variable valve is provided in the gas mixer 24, and the mechanical opening/closing operations of the valve change the mixing rate of the two gases A4a and A4b. However, the vibration from the mechanical operations is very low, and hardly transmits the vibration to the body of the exposure device in the constant temperature room 100.

Then, the gas A5 completely set at a constant temperature by the gas mixer 24 is blown into the constant temperature room 100 again as the gas A1 through the dust filter 21 in the filter room 22b, and is maintained at the target temperature in the constant temperature room 100. According to the present embodiment, the distance between the temperature sensor 19 and the gas mixer 24 is also short, and the control delay time can be shortened. As a result, there is no possibility that the temperature of the gas A5 becomes unstable during the temperature control.

In addition, according to the present aspect of the embodiment, the control system 25 transmits an instruction to the heaters 14a and 14b in the fluid supply device 11A when the mixing rate of the gas mixer 24 is set such that one gas is constantly used more in quantity in order to change the temperature of the gases A4a and 14b provided from the heaters 14a and 14b. That is, when only a large volume of a high-temperature gas is used, the temperature of the gas provided from both heaters 14a and 14b is made to rise. When only a large volume of a low-temperature gas is used, the temperature of the gas provided from both heaters 14a and 14b is made to drop.

In the present embodiment, the mixing rate between the two gases 4a and A4b is controlled to adjust the temperature of a provided gas as described above. However, the present invention is not limited to this application, but three or more gases can be mixed to adjust the temperature. Thus, the temperature can be adjusted with higher precision.

Although the fluid supply devices 11 and 11A are mounted on the floor below the floor F1 of the factory in which the body of an exposure device is mounted according to the above described embodiments, the position on which the fluid supply devices 11 and 11A are mounted is not limited to this designation, but can be mounted on the floor above the floor on which the chamber 1 is mounted in the factory, can be mounted at separate positions on the same floor, or the fluid supply devices 11 and 11A can be independently mounted in the chamber 1. However, when the fluid supply devices 11 and 11A are mounted on the same floor as the chamber 1, it is necessary to keep a distance long enough to attenuate the vibration transmitted between them, or to provide a vibration-proof pad between the fluid supply device and the floor F1. It is desired that the distance is long enough to attenuate the vibration of the fluid supply device 11 in the chamber 1 by at least 25% (6 dB) of the original vibration. However, since the distance depends on various elements such as the material of the floor, the building structure, etc., it should be obtained with all elements taken into account when the fluid supply device 11 is mounted.

The chamber 1 and the fluid supply device 11 can be mounted close to each other by providing a vibration-proof pad between the chamber 1 and the fluid supply device 11, and the floor F1, forming the blow duct 16 or the exhaust duct 17 connected to the chamber 1 and the fluid supply device 11 with the material having a vibration-proof function (for example, rubber), or by designing a structure having a vibration-proof function (for example, a bellows structure).

Furthermore, any one of the fluid supply devices 11 and 11A can supply a gas for a constant temperature to a plurality of exposure apparatuses.

In addition, the gas to be supplied from the fluid supply devices 11 and 11A to the chamber 1 is not limited to air. For example, it can be a nitrogen gas, a helium gas, etc.

In the descriptions above, the fluid to be supplied to the chamber 1 is a gas, but a liquid can be used for a constant temperature in the recent exposure apparatuses. Therefore, in the exposure apparatus described above, a predetermined liquid is set at a constant temperature in a fluid supply device located separate from the chamber 1, led into the chamber 1, and then the temperature is slightly amended as described above in each of the embodiments of the present invention. Otherwise, in an external fluid supply device, two kinds of liquids are generated as set at respective constant temperatures, and mixed in the chamber 1 to generate a liquid of a constant temperature so that the constant-temperature liquid can be used for adjusting the temperature of a local area of the exposure apparatus.

Figure 6:
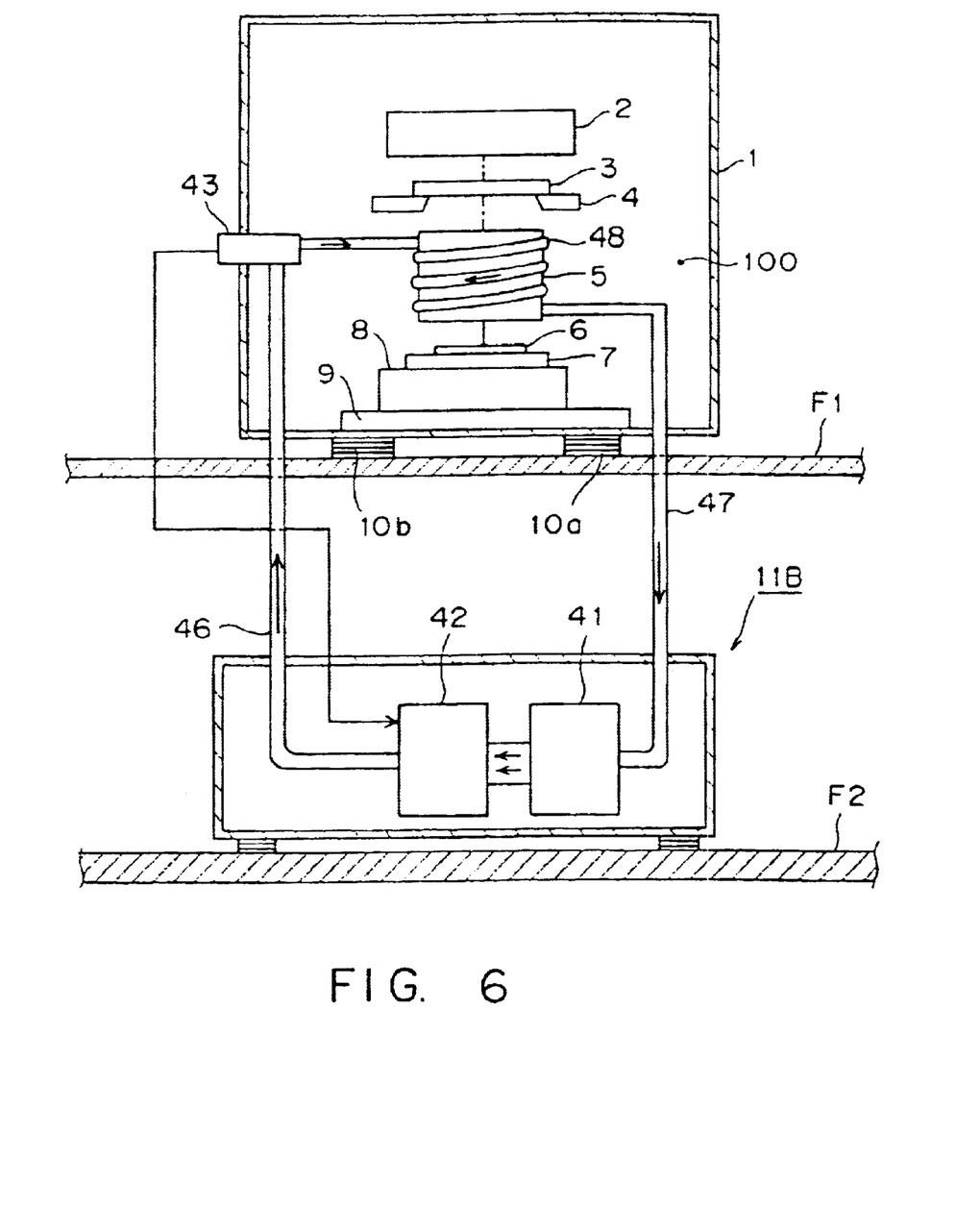
FIG. 6 is a sectional view showing the general configuration of the second embodiment of the exposure apparatus embodying the present invention.

FIG. 6 shows the configuration of the exposure apparatus according to the second aspect of the present embodiment. In the present aspect, a liquid is used as a fluid for temperature control to temperature-control the projective optical system 5 which is one of the local areas of the exposure apparatus. In FIG. 6, the portion corresponding to that shown in FIG. 3 is assigned the same unit number in explaining the system in detail.

In FIG. 6, the body of the exposure device having the projective optical system 5, etc. is mounted in the constant temperature room 100. Round the projective optical system 5, a temperature control pipe 48 through which a liquid for temperature control is spirally arranged, and the liquid flowing inside the pipe is temperature-controlled, thereby temperature-controlling the projective optical system 5.

For example, the water which is a liquid whose temperature is adjusted to control the projective optical system 5 at a constant temperature flows in a water supply pipe 46, and is led to the constant temperature room 100 of the chamber 1 by a compressor 41 and a main temperature controller 42 in the fluid supply device 11B mounted on the floor F2 below the floor F1 on which the chamber 1 is mounted. A temperature sub-controller 43 mounted in the constant temperature room 100 re-adjusts the water temperature which has slightly changed while the water flows through the water supply pipe 46. The temperature adjustment by the temperature sub-controller 43 is different in small temperature adjustment from the temperature adjustment by the fluid supply device 11B for adjusting the water temperature which may have largely changed. Therefore, the vibration can be generated by the fluid supply device 11B while a vibration is hardly transmitted during the temperature adjustment by the temperature sub-controller 43. The water whose temperature is adjusted by the temperature sub-controller 43 controls the projective optical system 5 at a constant temperature while it flows through the spiral temperature control pipe 48 mounted round the projective optical system 5. After controlling the temperature of the projective optical system 5, the water returns to the fluid supply device 11B through a water supply pipe 47, and repeats the above described temperature control.

As described above, the present invention is applicable to the temperature control using a gas or a liquid. The fluid supply device 11 using each medium is 11A and 11B as individually described above. However, according to the present invention, the temperatures of both gas and liquid can be controlled using a fluid supply device. In this case, the area (footprint) required for an exposure apparatus can be reduced, thereby unifying a vibration source, and reducing the transmission of a vibration to the chamber.

Thus, the present invention is not limited to any aspect of the above described embodiments, but can be used with various configurations within the scope of the gist of the present invention.

According to the temperature control method, the temperature in a chamber can be controlled by controlling the temperature of the fluid transmitted between a fluid supply device and the chamber. Since there are no temperature control units generating a vibration, the deterioration in alignment precision of the body of the exposure device caused by the vibration during the temperature control, and the deterioration in the contrast of a transferred image can be successfully reduced.

Then, according to the first exposure apparatus, the temperature control method according to the present invention can be almost completely used. In addition, when a temperature control device for controlling the temperature of a fluid output from the fluid supply device, and transmitting it into the chamber is provided so that the temperature in the chamber can be controlled at a predetermined temperature, the final temperature of the fluid input to the chamber is not controlled by a separately mounted fluid supply device, but by a temperature control device provided actually close to the chamber. Therefore, although the fluid supply device is separate from the chamber, the temperature in the chamber, or the temperature of the fluid used in the chamber can be constantly maintained with high precision.

Furthermore, since the temperature control device for controlling the temperature in the chamber is mounted outside the chamber, the floor area (footprint) required to mount a chamber (body of the exposure device) can be reduced, and a larger number of exposure apparatuses can be provided in the same area of a factory.

In addition, when the fluid supply device comprises a fluid supply device for controlling the temperature of a fluid, the fluid supply device roughly and preliminarily controls the temperature of the fluid. Therefore, the amount of control of the temperature by the temperature control device can be mostly suppressed. As a result, the temperature control device can be a temperature control element without a vibration source such as a Peltier element, a heater, etc., the influence of a vibration on the chamber can be furthermore reduced.

Additionally, when the fluid supply device outputs a plurality of fluids at different temperatures, and the temperature control device mixes the plural fluids at a predetermined rate, the amount of the heat generated during the temperature control can be reduced.

In addition, if a detector for detecting the temperature of the fluid controlled by the temperature control device is additionally provided, and at least one of the temperature control device and the fluid supply device controls the temperature of the fluid based on the detection result from the detector, then the temperature in the chamber can be controlled with high precision based on the actual temperature in the chamber.

When the fluid supply device is mounted on a floor different from the floor on which the chamber is mounted, the vibration generated by the fluid supply device is not transmitted into the chamber.

When the fluid supply device is mounted such that the vibration of the fluid supply device cannot be transmitted to the body of the exposure device, the alignment precision, etc. of the body of the exposure device can be furthermore improved.

According to the second embodiment of the exposure apparatus of the present invention, the temperature control method of the present invention can be used. In addition, since a larger part of the temperature control device for controlling the temperature in the chamber is moved outside the chamber, the floor area (footprint) required to mount a chamber (body of the exposure device) can be reduced, and a larger number of exposure apparatuses can be mounted in the same area of a factory.

What is claimed is:

1. An exposure system, comprising:
    a chamber which contains a body of an exposure apparatus that forms pattern on a substrate; and
    a fluid supply device, which is mounted on a mount plane having a height that is different from a height of a mount plane on which said chamber is mounted, and which includes a first temperature control unit for controlling a temperature of the fluid to a predetermined temperature, and supplies to the chamber the fluid of which the temperature has been controlled by the first temperature control unit.

2. The system according to claim 1, wherein said fluid supply device is mounted using a vibration-proof material.

3. The system according to claim 1, wherein said fluid supply device is mounted on a floor different from a floor on which said chamber is mounted.

4. The system according to claim 3, wherein said fluid supply device is mounted on a floor below a floor on which said chamber is mounted.

5. The system according to claim 1, further comprising:
a light source, which is mounted on a mount plane having a height that is different from the height of the mount plane on which said chamber is mounted, and which generates a light illuminating the pattern.

6. The system according to claim 5, wherein
said light source is mounted on the same plane as said fluid supply device.

7. The system according to claim 6, wherein
said light source is mounted on the floor using a vibration-proof material.

8. The system according to claim 7, wherein
said light source includes an excimer laser light source.

9. The system according to claim 1, wherein
said fluid supply device supplies a plurality of fluids at different temperatures to said chamber.

10. The system according to claim 9, further comprising:
a mixer, mounted in said chamber, supplying fluids after changing a mixing rate of a plurality of fluids at different temperatures supplied from said fluid supply device.

11. The system according to claim 10, further comprising:
a temperature sensor, mounted in said chamber, detecting a temperature of a fluid supplied from said mixer, wherein said mixer adjusts the temperature of the fluid based on an output from said temperature sensor.

12. The system according to claim 1, wherein
said fluid supply device is connected to said chamber using a duct having a vibration-proof function.

13. The system according to claim 12, wherein said duct is formed by a vibration-proof material, and/or has a vibration-proof structure.

14. The system according to claim 13, wherein said duct is made of elastic material.

15. The system according to claim 13, wherein said duct is shaped as a bellows structure.

16. A micro-device manufactured by forming the pattern onto a substrate using the body of the exposure apparatus according to claim 1.

17. The system according to claim 1, further comprising:
a second temperature control unit, which is mounted on a same floor as said chamber for controlling the temperature of the fluid of which the temperature has been controlled to the predetermined temperature by the first temperature control unit to a final target temperature so that the fluid of which the temperature has been controlled by the second temperature control unit is supplied to said chamber.

18. The system according to claim 17, wherein the second temperature control unit is mounted in said chamber.

19. The system according to claim 18, wherein the first temperature control unit comprises a cooler.

20. The system according to claim 19, wherein the second temperature control unit comprises a Peltier element.

21. An exposure system, comprising:
a chamber which contains a body of an exposure apparatus that forms a pattern on a substrate;
a fluid supply device, which includes a first temperature control unit for controlling a temperature of a fluid to a predetermined temperature and is mounted at a position separated from said chamber, and supplies the fluid to said chamber; and
a second temperature control unit, which is mounted in the chamber and controls the temperature of the fluid of which the temperature has been controlled to the predetermined temperature by the first temperature control unit, to a final target temperature so that the fluid of which the temperature has been controlled to the final target temperature by the second temperature control unit is supplied to the chamber,
wherein at least one of said chamber and said fluid supply device is mounted on a mount plane using a vibration-proof material.

22. The system according to claim 21, wherein said fluid supply device is mounted on the same floor as said chamber.

23. The system according to claim 22, wherein said fluid supply device and said chamber are separated by a distance which attenuates a ratio of transmission of said vibration to said chamber by 25% or more as compared with mounting said fluid supply device in said chamber.

24. The system according to claim 21, further comprising:
a light source, mounted on a floor different from a floor on which said chamber is mounted, generating a tight illuminating the pattern.

25. The system according to claim 24, wherein said light source is mounted using a vibration-proof material.

26. The system according to claim 25, wherein
said light source includes an excimer laser light source.

27. The system according to claim 21, wherein
said fluid supply device supplies a plurality of fluids at different temperatures to said chamber.

28. The system according to claim 27, further comprising:
a mixer, mounted in said chamber, supplying fluids after changing a mixing rate of a plurality of fluids at different temperatures supplied from said fluid supply device.

29. The system according to claim 21, wherein
said fluid supply device is connected to said chamber using a duct having a vibration-proof function.

30. The system according to claim 29, wherein said duct is formed by a vibration-proof material, and/or has a vibration-proof structure.

31. The system according to claim 30, wherein said duct is made of elastic material.

32. The system according to claim 30, wherein said duct is shaped as a bellows structure.

33. A micro-device manufactured by forming the pattern onto a substrate using the body of the exposure apparatus according to claim 21.

34. The system according to claim 21, wherein the first temperature control unit comprises a cooler.

35. The system according to claim 34, wherein the second temperature control unit comprises a Peltier element.

36. A temperature control method of controlling a temperature in a chamber containing a body of an exposure apparatus forming a pattern on a substrate, comprising:
performing a first temperature control, at a fluid supply device mounted on a first mount plane having a height that is different from a height of a second mount plane on which the chamber is mounted, in order to control a temperature of a fluid to a predetermined temperature; and
supplying into the chamber the fluid on which the first temperature control has been performed.

37. The method according to claim 36, wherein
said fluid supply device supplies a plurality of fluids at different temperatures to said chamber.

38. The method according to claim 37, further comprising:
supplying fluids after changing a mixing rate of a plurality of fluids at different temperatures supplied from said fluid supply device.

39. The method according to claim 36, wherein
said fluid supply device is mounted on a floor different from a floor on which said chamber is mounted.

40. The method according to claim 36, further comprising:
performing a second temperature control for controlling the temperature of the fluid on which said first temperature control has been performed to a final target temperature; and
supplying to said chamber the fluid on which the second temperature control has been performed.

41. A temperature control method of controlling a temperature in a chamber containing a body of an exposure apparatus forming a pattern on a substrate, comprising:
performing a first temperature control in order to control a temperature of a fluid to a predetermined temperature at a fluid supply device mounted separate from said chamber;
performing at said chamber, a second temperature control in order to control the temperature of the fluid on which the first temperature control has been performed, to a final target temperature;
supplying to said chamber the fluid on which the second temperature control has been performed; and
mounting at least one of said chamber and said fluid supply device on a mount plane using a vibration-proof material.

42. The method according to claim 41, wherein
said fluid supply device supplies a plurality of fluids at different temperatures to said chamber.

43. The method according to claim 42, further comprising:
supplying fluids to the body of the exposure apparatus after changing a mixing ratio of a plurality of fluids at different temperatures supplied from said fluid supply device.

44. An exposure system manufacturing method comprising:
providing on a mount plane a chamber which contains a body of an exposure apparatus which forms a pattern on a substrate; and
providing a fluid supply device which supplies a fluid to said chamber on a first mount plane having a height that is different from a height of a second mount plane on which the chamber is mounted, and which includes a first temperature control unit for controlling a temperature of the fluid to a predetermined temperature so that the fluid of which the temperature has been controlled by the first temperature control unit is supplied to the chamber.

45. The method according to claim 44, wherein
said fluid supply device is mounted using a vibration-proof material.

46. The method according to claim 44, wherein
said fluid supply device is mounted on a floor different from a floor on which said chamber is mounted.

47. The method according to claim 46, wherein
said fluid supply device is mounted on a floor below the floor on which said chamber is mounted.

48. The method according to claim 47, further comprising:
providing an excimer laser light source generating an excimer laser light illuminating the pattern on the same floor as said fluid supply device.

49. The method according to claim 44, further comprising:
providing a duct having a vibration-proof function and connecting said chamber with said fluid supply device.

50. The method according to claims 44, further comprising:
mounting a second temperature control unit on a same floor as said chamber for controlling the temperature of the fluid of which the temperature has been controlled to said predetermined temperature by the first temperature control unit to a final target temperature so that the fluid of which the temperature has been controlled by the second temperature control unit is supplied to said chamber.

51. The method according to claim 50, wherein the second temperature control unit is mounted in said chamber.

52. An exposure system manufacturing method comprising:
providing a chamber which contains a body of an exposure apparatus which forms a pattern on a substrate; and
providing a fluid supply device which includes a first temperature control unit for controlling a temperature of the fluid to a predetermined temperature, and is mounted usina a vibration-proof material at a separate position from said chamber and supplies the fluid to the chamber; and
providing in said chamber, a second temperature control unit that controls the temperature of the fluid of which the temperature has been controlled to the predetermined temperature by the first temperature control unit to a final target temperature so that the fluid of which the temperature has been controlled by the second temperature control unit is supplied to the chamber.

53. The method according to claim 52, wherein
said fluid supply device is mounted on the same floor as said chamber.

54. The method according to claim 52, further comprising:
providing an excimer laser light source which generates an excimer laser light which illuminates the pattern on a same floor on which said fluid supply device is mounted, and below a floor on which said chamber is mounted.

55. The method according to claim 52, further comprising:
providing a duct having a vibration-proof function and connecting said chamber with said fluid supply device mounted outside said chamber.

56. The method according to claim 52, wherein
said chamber is mounted using a vibration-proof material.

57. An exposure system manufacturing method comprising:
mounting using a vibration-proof material a chamber which contains a body of an exposure apparatus which forms a pattern on a substrate;
mounting at a separate position from said chamber a fluid supply devices, which includes a first temperature control unit for controlling a temperature of a fluid to a predetermined temperature, and supplies the fluid to said chamber; and
mounting in said chamber, a second temperature control unit which controls the temperature of the fluid of which the temperature has been controlled to the predetermined temperature by the first temperature control unit to a final target temperature so that the fluid of which the temperature has been controlled by the second temperature control unit is supplied to the chamber.

58. A semiconductor factory comprising:

a first floor on which a chamber is mounted, the chamber containing a body of an exposure apparatus that forms a pattern on a substrate; and a second floor that is different from the first floor, wherein a fluid supply device is mounted on the second floor, the fluid supply device includes a first temperature control unit for controlling a temperature of a fluid to a predetermined temperature and supplies to said chamber the fluid of which the temperature has been controlled by the first temperature control unit.

59. The factory according to claim 58, further comprising:

a second temperature control unit mounted on the first floor, and which controls the temperature of the fluid of which the temperature has been controlled to said predetermined temperature by the first temperature control unit to a final target temperature so that the fluid of which the temperature has been controlled by the second temperature control unit is supplied to said chamber.

60. The factory according to claim 59, wherein the second temperature control unit is mounted in said chamber.

61. The factory according to claim 59, wherein the first temperature control unit comprises a cooler.

62. The factory according to claim 61, wherein the second temperature control unit comprises a Peltier element.

63. The factory according to claim 61, wherein the second floor is a floor of a lower level story than the story of the first floor.

64. The factory according to claim 58, further comprising:

a light source, mounted on the second floor, and which generates illumination light for illuminating a mask.

65. The factory according to claim 59, wherein, at least one of said chamber and said supply device is mounted on a floor using a vibration-proof material.

* * * * *